(12) United States Patent
Yamamoto

(10) Patent No.: US 10,117,354 B2
(45) Date of Patent: Oct. 30, 2018

(54) MOTOR DRIVE UNIT PROVIDED WITH HOUSING FORMED WITH OPENING

(71) Applicant: FANUC CORPORATION, Yamanashi (JP)

(72) Inventor: Kazuhiro Yamamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/711,848

(22) Filed: May 14, 2015

(65) Prior Publication Data
US 2015/0334857 A1 Nov. 19, 2015

(30) Foreign Application Priority Data
May 16, 2014 (JP) .................................. 2014-102688

(51) Int. Cl.
| H05K 5/00 | (2006.01) |
| H05K 7/20 | (2006.01) |
| H05K 5/02 | (2006.01) |
| H05K 7/14 | (2006.01) |

(52) U.S. Cl.
CPC ....... *H05K 7/20127* (2013.01); *H05K 5/0021* (2013.01); *H05K 5/0213* (2013.01); *H05K 7/1432* (2013.01)

(58) Field of Classification Search
CPC .......................... H05K 5/0213; H05K 5/0021
See application file for complete search history.

(56) References Cited

U.S. PATENT DOCUMENTS

| 5,361,188 A | 11/1994 | Kondou et al. |
| 10,004,150 B2 * | 6/2018 | Dernier ............... H05K 5/0013 |
| 2006/0087805 A1 | 4/2006 | Massih |
| 2013/0082584 A1 * | 4/2013 | Li ........................ H05K 5/0213 312/223.2 |
| 2013/0120945 A1 * | 5/2013 | Zhao ..................... H05K 7/142 361/759 |

(Continued)

FOREIGN PATENT DOCUMENTS

| DE | 20204252 U1 | 7/2003 |
| DE | 10338469 A1 | 11/2004 |

(Continued)

OTHER PUBLICATIONS

English Abstract and Machine Translation for Japanese Publication No. 2009-253183 published Oct. 29, 2009, 11 pgs.

(Continued)

*Primary Examiner* — Hung V Ngo
(74) *Attorney, Agent, or Firm* — Fredrickson & Byron, P.A.

(57) ABSTRACT

A motor drive unit which improves the cooling ability. The motor drive unit comprises electronic components and a housing which surrounds the electronic components. The housing has a back plate to which the electronic components are fixed, a front plate which faces the back plate, and a first side plate and second side plate which face each other and extend from the back plate to the front plate. The first side plate has openings which pass through the first side plate and slants with respect to the back plate so as to approach the second side plate or separate from the second side plate the further from the back plate toward the front plate.

6 Claims, 14 Drawing Sheets

(56) References Cited

U.S. PATENT DOCUMENTS

2014/0002992 A1* 1/2014 Claeys ................ H05K 5/0213
                                                                    361/695

FOREIGN PATENT DOCUMENTS

| DE | 102007026898 A1 | 5/2008 |
| DE | 102009014148 A1 | 10/2010 |
| JP | 63102484 U | 7/1988 |
| JP | 11163545 A | 6/1999 |
| JP | 200479698 A | 3/2004 |
| JP | 2009253183 A | 10/2009 |

OTHER PUBLICATIONS

English Abstract and Machine Translation for Japanese Publication No. 2004-079698 A, published Mar. 11, 2004, 6 pgs.
English Abstract and Machine Translation for Japanese Publication No. 11-163545 A, published Jun. 18, 1999, 14 pgs.
English Translation of claims for Japanese Publication No. 63-102484 U1, published Jul. 4, 1988, 2 pgs.
English Abstract and Machine Translation for German Publication No. 102009014148 A1, published Oct. 7, 2010, 8 pgs.
English Abstract and Machine Translation for German Publication No. 102007026898 A1, published May 15, 2008, 9 pgs.
English Abstract and Machine Translation for German Publication No. 20204252 U1, published Jul. 31, 2003, 7 pgs.
English Abstract and Machine Translation for German Publication No. 10338469 A1, published Nov. 25, 2004, 6 pgs.

* cited by examiner

MOTOR DRIVE UNIT PROVIDED WITH HOUSING FORMED WITH OPENING

BACKGROUND OF THE INVENTION

1. Field of the Invention

The present invention relates to a motor drive unit which is provided with a housing at which an opening is formed.

2. Description of the Related Art

A motor drive unit is provided with a power device and other electronic components which generate heat at the time of operation. In the past, it has been known to form openings at the wall surfaces of the housing so as to cool such electronic components at the time of operation of the motor drive unit (for example, Japanese Patent Publication No. 2009-253183A).

Usually, a plurality of motor drive units are mounted in close proximity with each other on a cabinet. In this case, in motor drive units adjoining each other in this case, the flow of air through the openings which are provided at the housing of one motor drive unit is liable to be blocked by the housing of another motor drive unit and therefore the cooling ability of the motor drive unit is liable to end up falling.

SUMMARY OF THE INVENTION

In one aspect of the present invention, the motor drive unit mounted on a cabinet comprises an electronic component and a housing which surrounds the electronic components. The housing includes a back plate fixed to the cabinet, a front plate opposite the back plate, and a first side plate and a second side plate which extend from the back plate to the front plate so as to be opposite to each other. The first side plate includes an opening extending through the first side plate, and is slanted with respect to the back plate so as to approach the second side plate or separate from the second side plate as extending from the back plate toward the front plate.

The first side plate and second side plate may also be slanted with respect to the back plate so as to approach each other as extending from the back plate toward the front plate. The first side plate and the second side plate may also be slanted with respect to the back plate so as to separate from each other as extending from the back plate toward the front plate.

The housing may further include a third side plate and a fourth side plate which extend from the back plate to the front plate so as to be opposite to each other, and which extend between the first side plate and the second side plate. The third side plate includes an opening extending through the third side plate and is slanted with respect to the back plate so as to approach the fourth side plate or separate from the fourth side plate as extending from the back plate toward the front plate.

The third side plate and fourth side plate may also be slanted with respect to the back plate so as to approach each other as extending from the back plate toward the front plate. The third side plate and the fourth side plate may also be slanted with respect to the back plate so as to separate from each other as extending from the back plate toward the front plate.

BRIEF DESCRIPTION OF THE DRAWINGS

These and other objects, features, and advantages of the present invention will become clearer with reference to the detailed description of illustrative embodiments of the present invention which are shown in the attached drawings, wherein.

DESCRIPTION OF THE PREFERRED EMBODIMENTS

Figure 1:
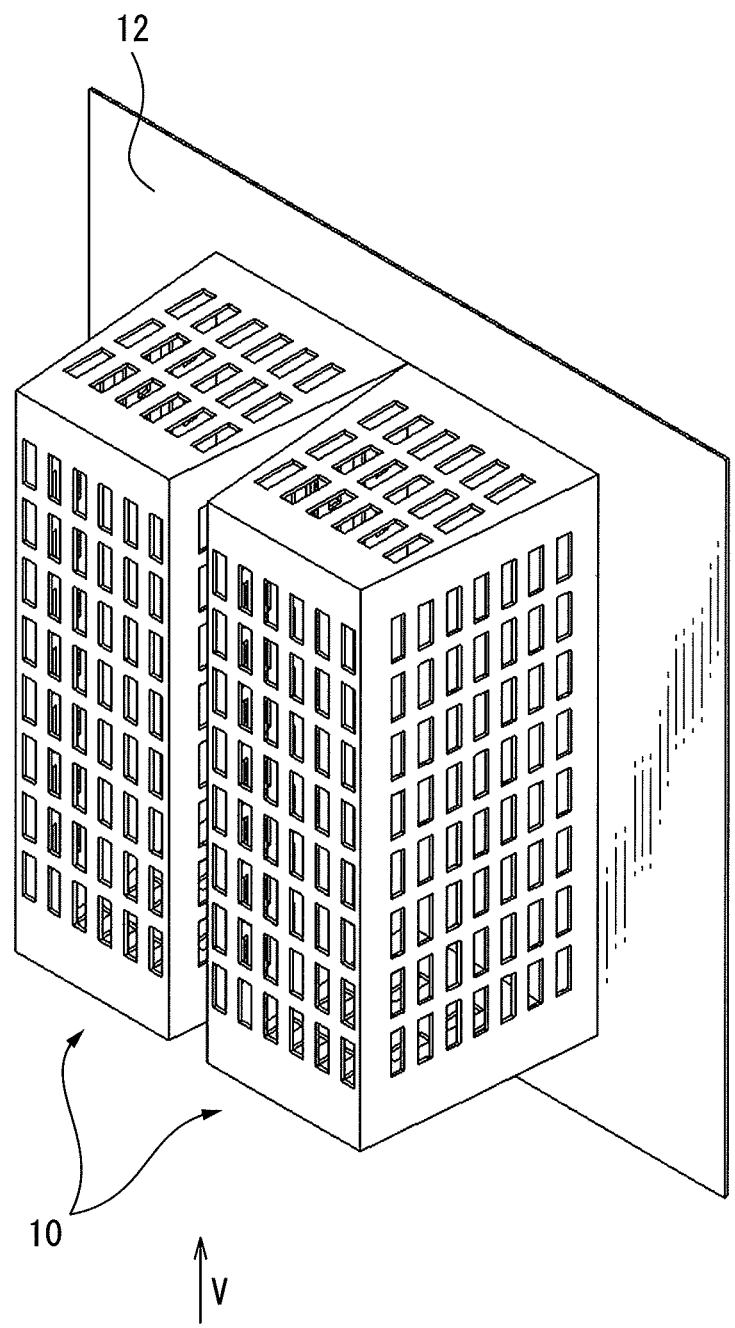
FIG. 1 is a perspective view showing that a plurality of motor drive units, each of which accords to an embodiment of the present invention, are arranged on a cabinet.
Figure 2:
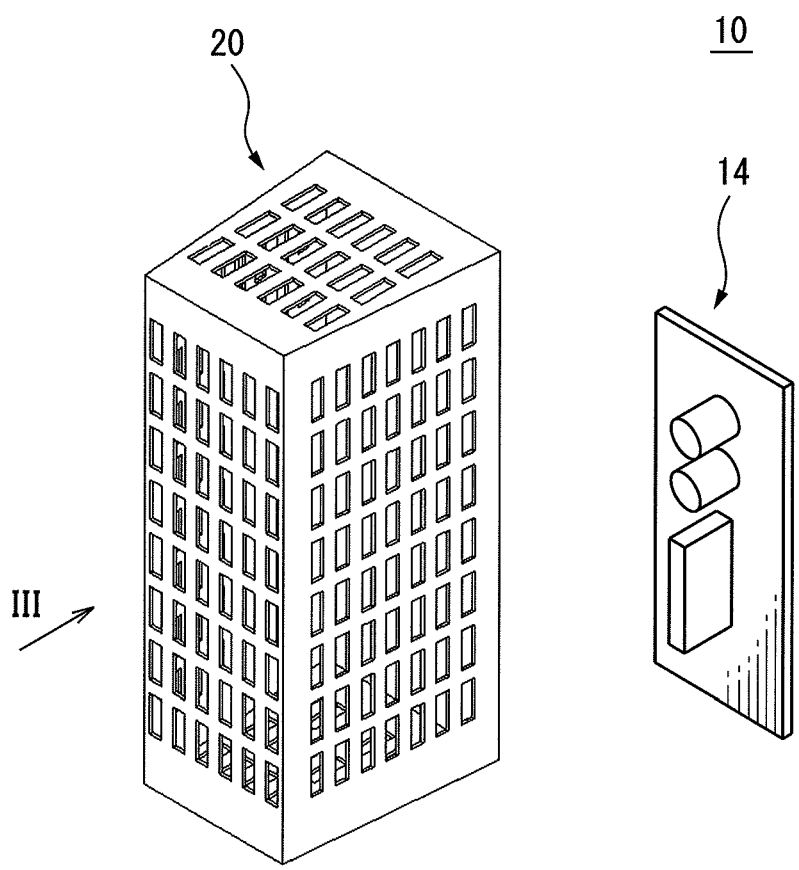
FIG. 2 is a disassembled perspective view of the motor drive unit shown in FIG. 1.

Below, embodiments of the present invention will be explained in detail based on the drawings. First, referring to FIG. 1 and FIG. 2, a motor drive unit 10 according to an embodiment of the present invention will be explained. As shown in FIG. 1, a plurality of the motor drive units 10 are mounted on a cabinet 12. These motor drive units 10 are arranged on the cabinet 12 in close proximity to each other at a high density. As shown in FIG. 2, each of the motor drive units 10 includes electronic components 14 and a housing 20 which surrounds the electronic components 14 and which houses them inside thereof. The electronic components 14 include an element, such as a power element, which generates heat at the time of operation of the motor drive unit 10.

Figure 3:
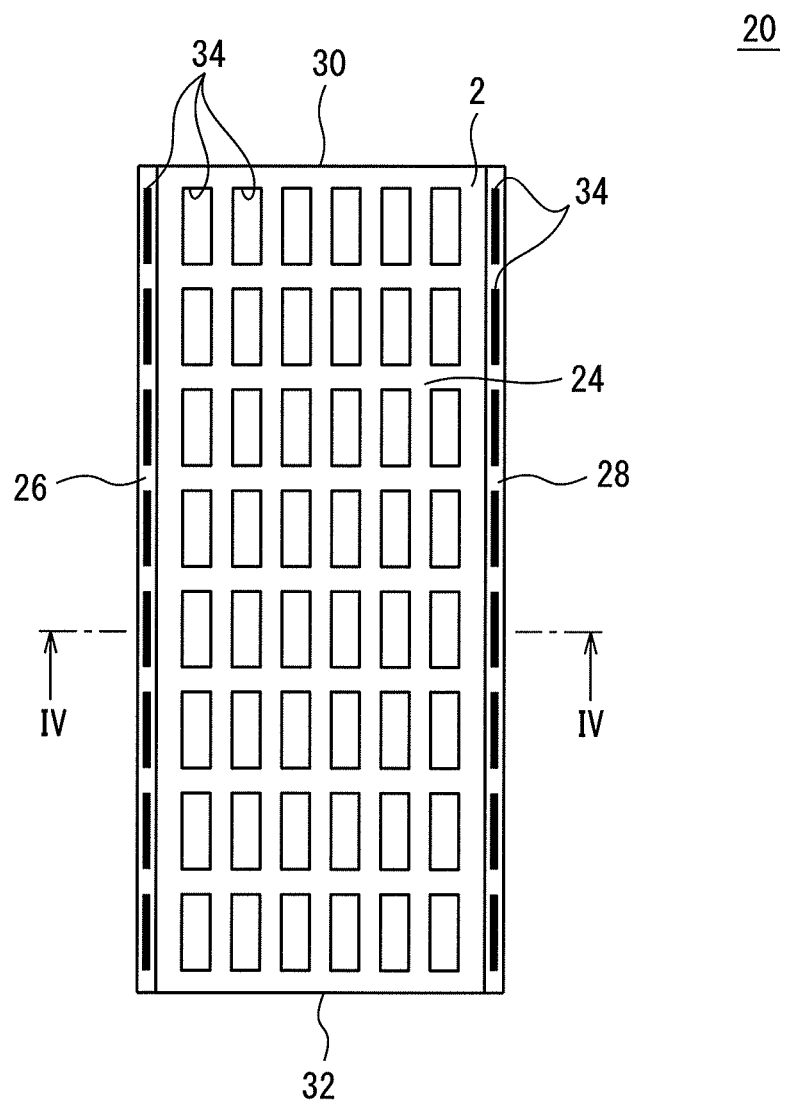
FIG. 3 is a front view of the housing of the motor drive unit shown in FIG. 2 as seen from the arrow III in FIG. 2.
Figure 4:
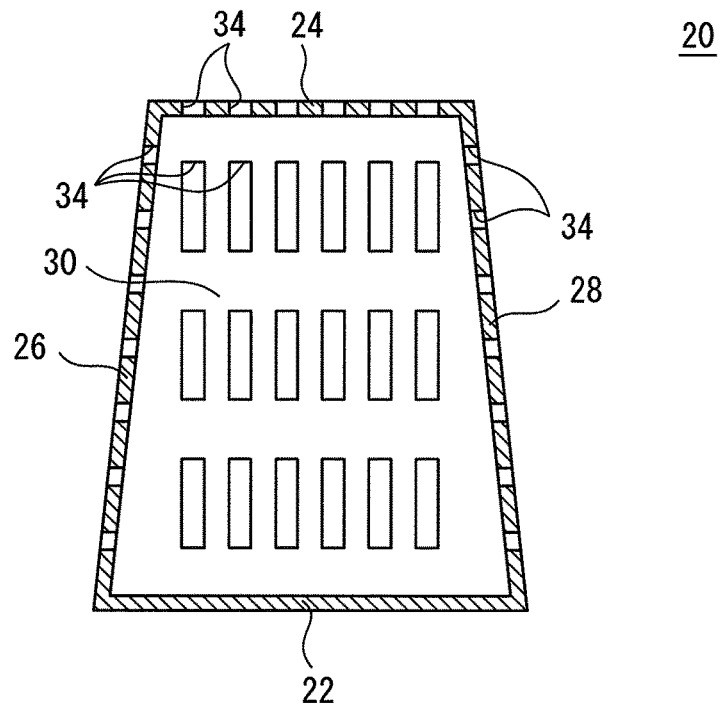
FIG. 4 is a cross-sectional view of the housing shown in FIG. 3 cut along IV-IV in FIG. 3.

Next, referring to FIG. 3 and FIG. 4, the housing 20 according to the present embodiment will be explained. The housing 20 includes a back plate 22; a front plate 24 opposite the back plate 22; and a side plate (first side plate) 26, side plate (second side plate) 28, side plate 30 and side plate 32 which extend from the back plate 22 to the front plate 24. The back plate 22 is fixed to the above-mentioned cabinet 12, while the electronic components 14 are fixed to the back plate 22.

The side plates 26 and 28 extend in the longitudinal direction of the housing 20 so as to be opposite to each other. In the present embodiment, the side plate 26 is slanted with respect to the back plate 22 so as to approach the side plate 28 as extending from the back plate 22 toward the front plate 24. Similarly, the side plate 28 is slanted with respect to the back plate 22 so as to approach the side plate 26 as extending from the back plate 22 toward the front plate 24.

Thus, in the present embodiment, both the side plates 26 and 28 are slanted relative to the back plate 22 so as to approach each other the further from the back plate 22 toward the front plate 24. Due to this, the width in the lateral direction of the housing 20 decreases the further from the back plate 22 toward the front plate 24.

On the other hand, the side plates 30 and 32 are arranged to be opposite to each other substantially in parallel and extend from the side plate 26 to the side plate 28 in the lateral direction of the housing 20. Each of the front plate 24, side plate 26, side plate 28, side plate 30, and side plate 32 is formed with a plurality of openings 34. The openings 34 are formed so as to extend through the front plate 24, side plate 26, side plate 28, side plate 30, and side plate 32.

Figure 5:
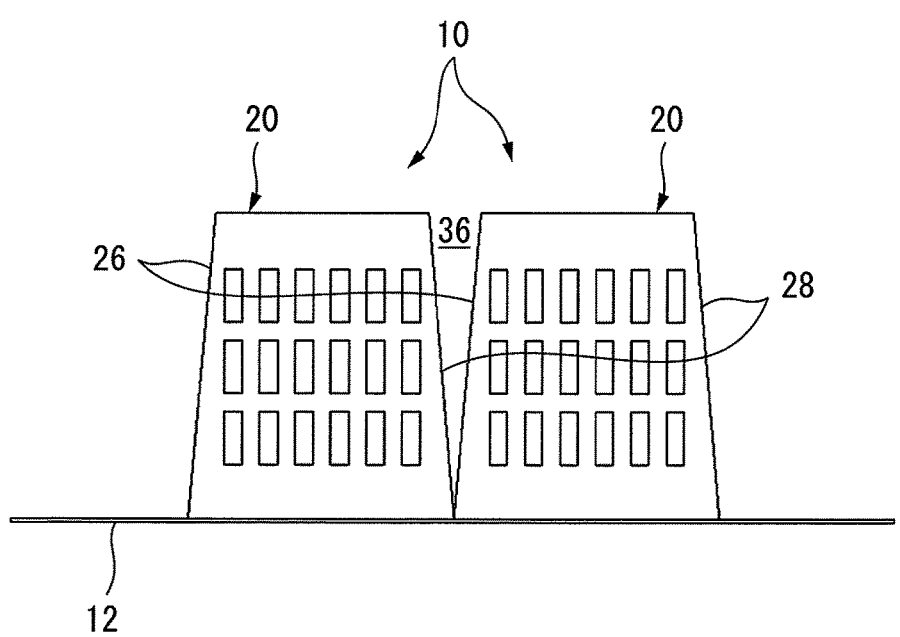
FIG. 5 is a view for explaining the function of the housing of the motor drive unit shown in FIG. 1 as seen from the arrow V in FIG. 1.

Next, referring to FIG. 5, the function of the housing 20 according to the present embodiment will be explained. As stated above, a plurality of motor drive units 10 are mounted in close proximity at a cabinet 12. In the example of FIG. 5, two of the motor drive units 10 are arranged in close proximity so that the side plate 28 of the housing 20 of one of the motor drive units 10 and the side plate 26 of the housing 20 of the other of the motor drive units 10 contact each other at their bottom ends. Here, the housing 20 of each of the motor drive units 10 according to the present embodiment has a side plate 26 and a side plate 28 which are slanted from each other.

According to this configuration, even when arranging the motor drive units 10 in close proximity as shown in FIG. 5, a gap 36 is formed between the side plate 28 of one motor drive unit 10 and the side plate 26 of the other motor drive unit 10 which faces the side plate 28.

Due to the gap 36, a smooth flow of air between adjoining motor drive units 10 can be generated. Therefore, it is possible to make the air inside of the housing 20 warmed by the electronic components 14 which generate heat upon the operation of the motor drive unit 10 to smoothly flow out from the housing 20 through the gap 36, while making the air at the outside of the housing 20 flow smoothly into the housing 20. Whereby, even when arranging a plurality of motor drive units 10 so as to adjoin each other at the cabinet 12, it is possible to improve the cooling ability upon the operation of the motor drive units 10.

Figure 6:
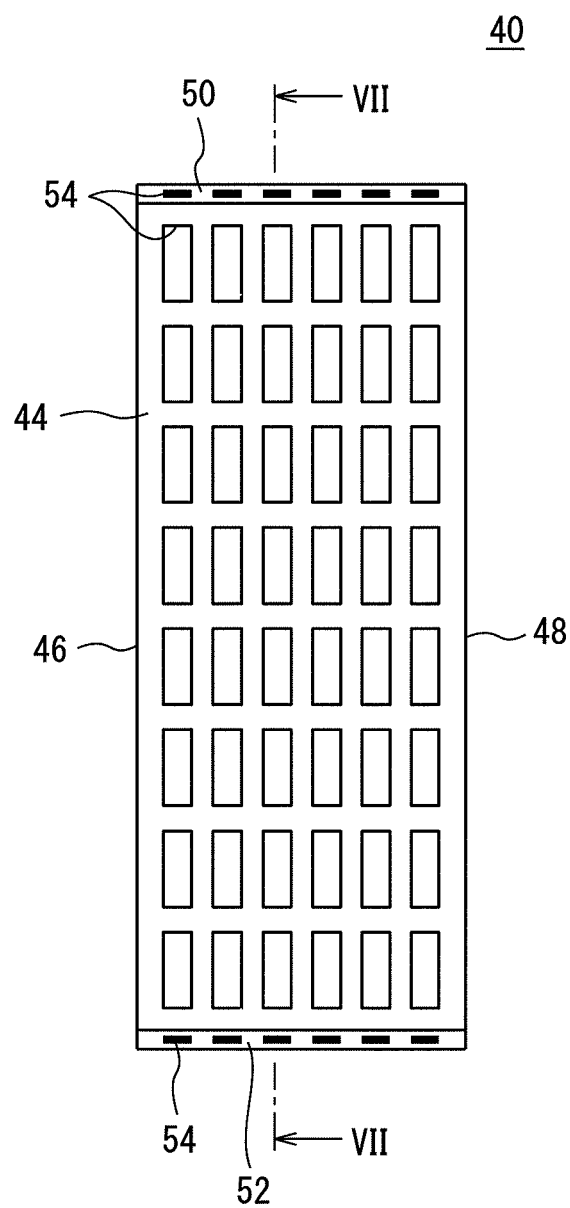
FIG. 6 is a front view of a housing according to another embodiment, the view corresponding to FIG. 3.
Figure 7:
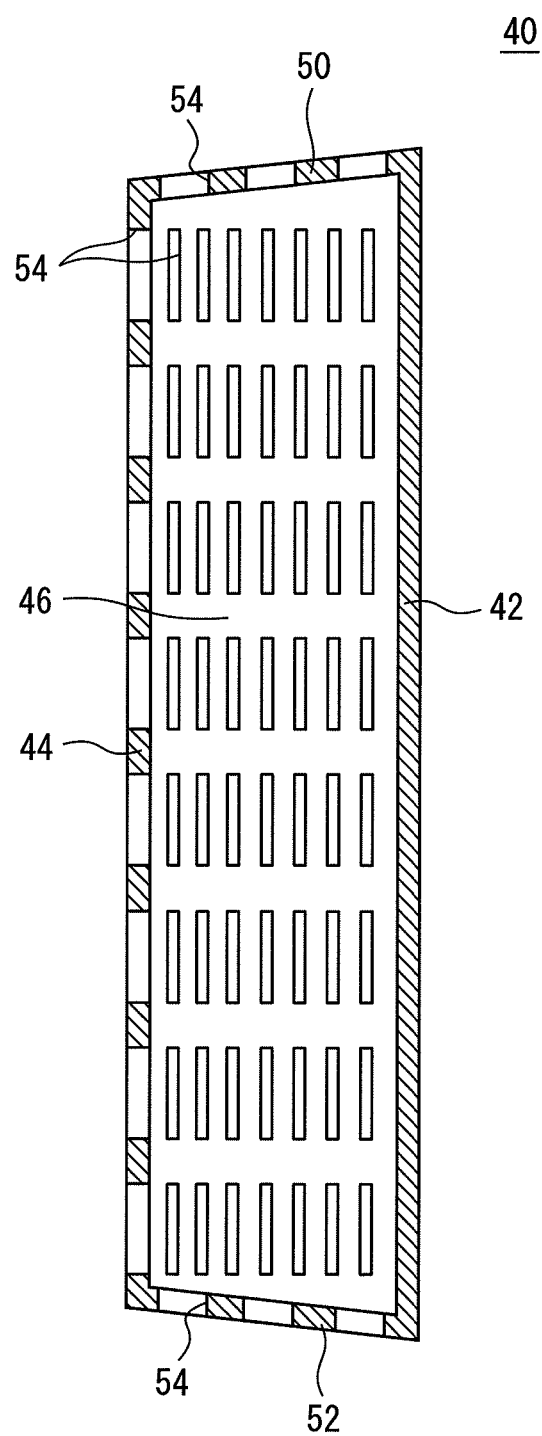
FIG. 7 is a cross-sectional view of the housing shown in FIG. 6 cut along VII-VII in FIG. 6.

Next, referring to FIGS. 6 and 7, the housing 40 according to another embodiment will be explained. The housing 40 can be applied to the motor drive unit 10, instead of the above-mentioned housing 20. The housing 40 includes a back plate 42; a front plate 44 opposite the back plate 42; and a side plate 46, side plate 48, side plate (first side plate) 50 and side plate (second side plate) 52 which extend from the back plate 42 to the front plate 44. The back plate 42 is fixed to the above-mentioned cabinet 12, while the electronic component 14 is fixed to the back plate 42.

The side plates 46 and 48 are arranged to be opposite to each other substantially in parallel and extend in the longitudinal direction of the housing 40. On the other hand, the side plates 50 and 52 are arranged to be opposite to each other and extend from the side plate 46 to the side plate 48 in the lateral direction of the housing 40. In the present embodiment, the side plate 50 is slanted relative to the back plate 42 so as to approach the side plate 52 as extending from the back plate 42 toward the front plate 44. Similarly, the side plate 52 is slanted relative to the back plate 42 so as to approach the side plate 50 as extending from the back plate 42 toward the front plate 44.

Thus, in the present embodiment, both of the side plates 50 and 52 are slanted with respect to the back plate 42 so as to approach each other the further from the back plate 42 toward the front plate 44. As a result, the length in the longitudinal direction of the housing 40 decreases the further from the back plate 42 toward the front plate 44. Similar to the above-mentioned embodiment, each of the front plate 44, side plate 46, side plate 48, side plate 50, and side plate 52 is formed with a plurality of openings 54.

Figure 8:
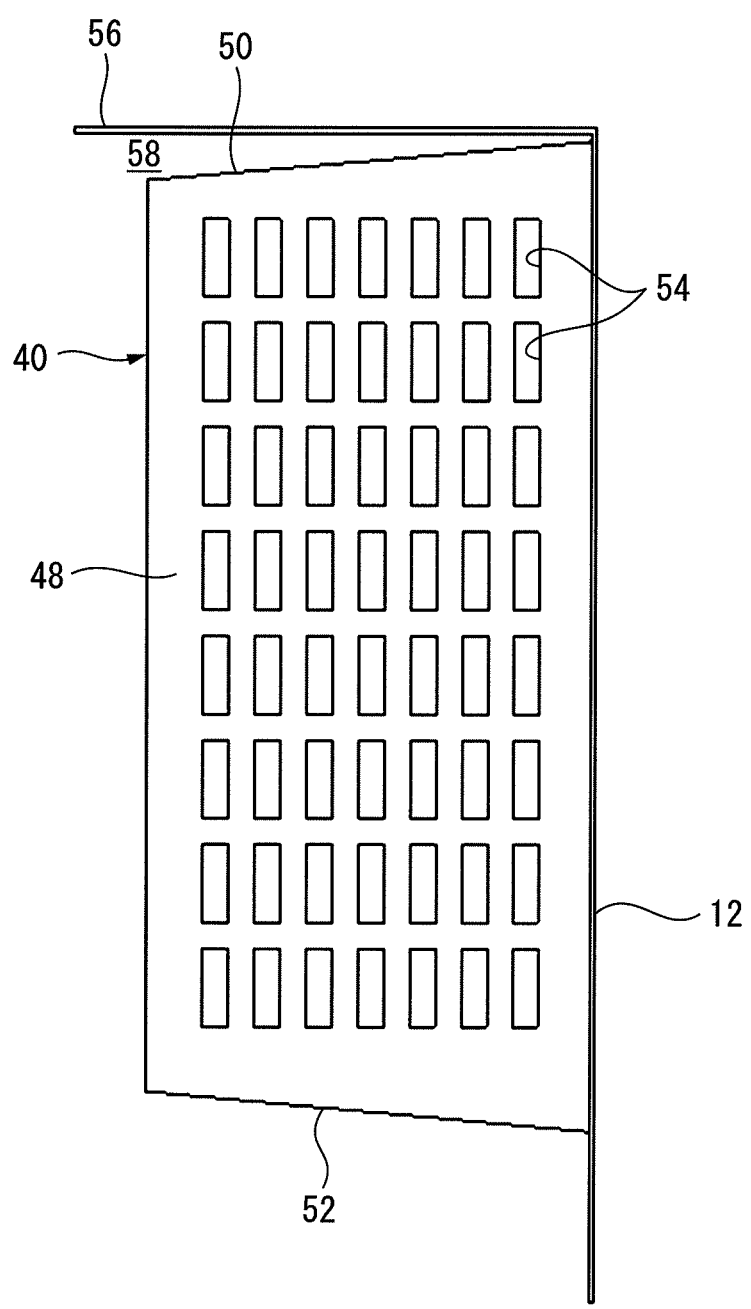
FIG. 8 is a view for explaining the function of the housing shown in FIG. 6.

Next, referring to FIG. 8, the function of the housing 40 according to the present embodiment will be explained. In the example shown in FIG. 8, a wall part 56 is provided so as to be substantially perpendicular to the cabinet 12, while the housing 40 is fixed on the cabinet 12 so that the side plate 50 faces the wall part 56 in close proximity. Since the side plate 50 is slanted with respect to the back plate 42 as explained above, a gap 58 is formed between the side plate 50 and the wall part 56. Due to the gap 58, a smooth air flow can be generated in-between the housing 40 and the wall part 56, whereby it is possible to improve the cooling ability during the operation of the motor drive units.

Figure 9:
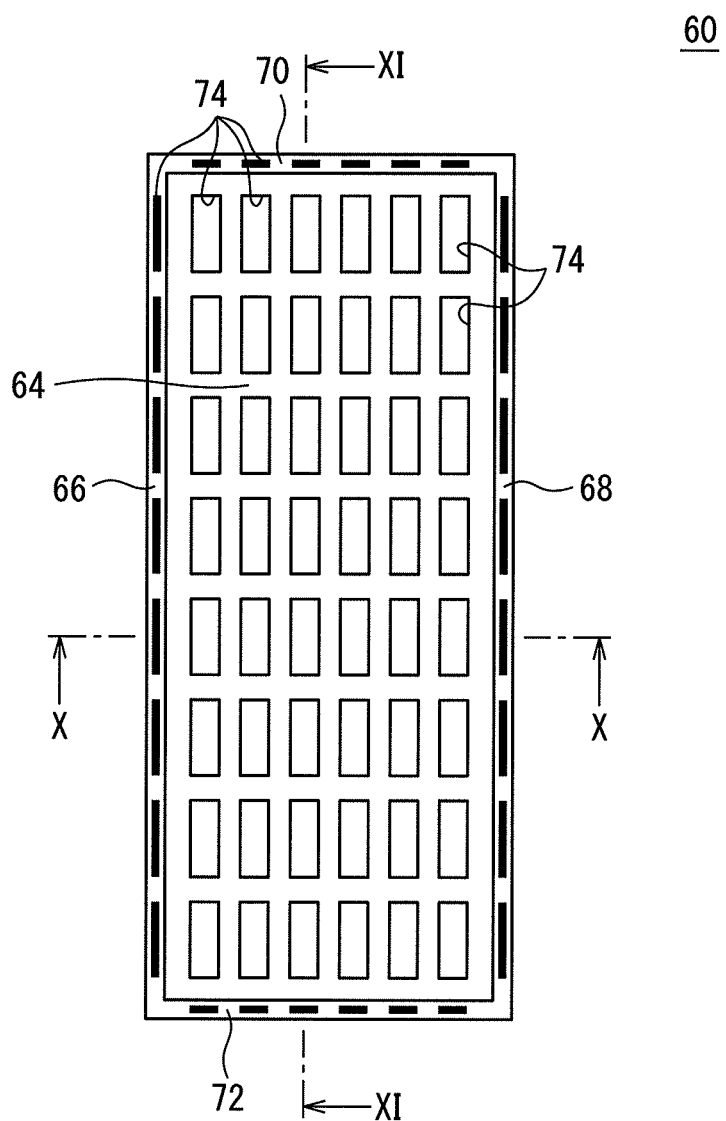
FIG. 9 is a front view of a housing according to still another embodiment, the view corresponding to FIG. 3.
Figure 10:
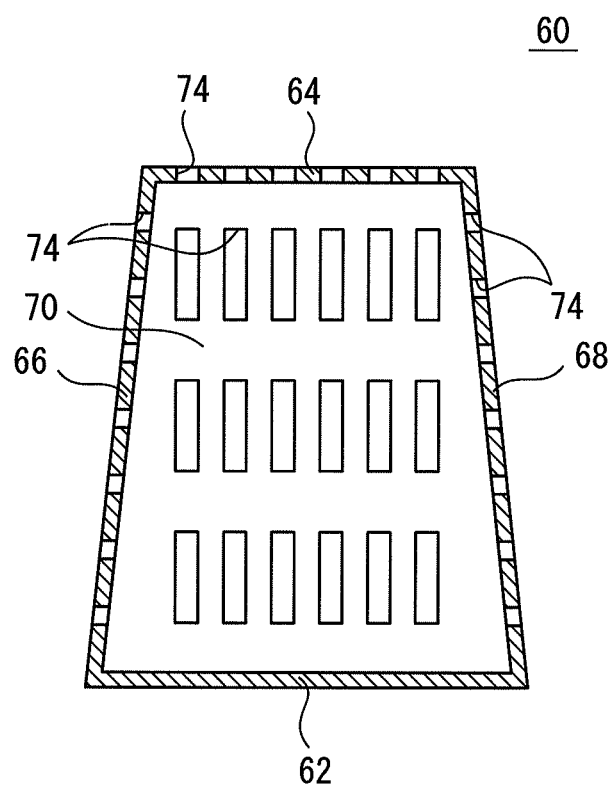
FIG. 10 is a cross-sectional view of the housing shown in FIG. 9 cut along X-X in FIG. 9.
Figure 11:
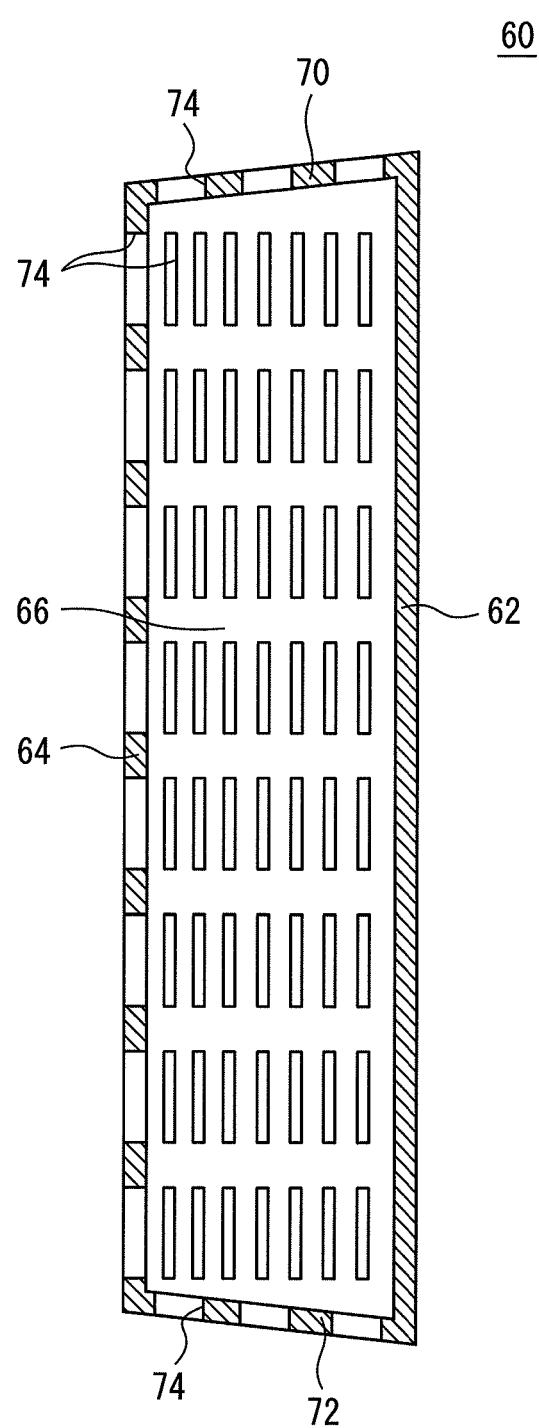
FIG. 11 is a cross-sectional view of the housing shown in FIG. 9 cut along XI-XI in FIG. 9.

Next, referring to FIG. 9 to FIG. 11, a housing 60 according to still another embodiment will be explained. The housing 60 includes a back plate 62; a front plate 64 opposite the back plate 62; and a side plate (first side plate) 66, side plate (second side plate) 68, side plate (third side plate) 70 and side plate (fourth side plate) 72 which extend from the back plate 62 to the front plate 64. The back plate 62 is fixed to the above-mentioned cabinet 12, while the electronic components 14 are fixed to the back plate 62.

The side plates 66 and 68 are arranged to be opposite to each other and extend in the long direction of the housing 60. The side plate 66 is slanted with respect to the back plate 62 so as to approach the side plate 68 as extending from the back plate 62 toward the front plate 64. Similarly, the side plate 68 is slanted with respect to the back plate 62 so as to approach the side plate 66 as extending from the back plate 62 toward the front plate 64.

On the other hand, the side plates 70 and 72 is arranged to be opposite to each other and extend from the side plate 66 to the side plate 68 in the lateral direction of the housing 60. The side plate 70 is slanted with respect to the back plate 62 so as to approach the side plate 72 as extending from the back plate 62 toward the front plate 64. Similarly, the side plate 72 is slanted with respect to the back plate 62 so as to approach the side plate 70 as extending from the back plate 62 toward the front plate 64.

Thus, in the present embodiment, all of the side plates 66, 68, 70, and 72 are slanted with respect to the back plate 62. As a result, the housing 60 becomes smaller in width in the short direction and length in the longitudinal direction the further from the back plate 62 toward the front plate 64. In addition, similar to the above-mentioned embodiment, each of the front plate 64, and the side plates 66, 68, 70, and 72 is formed with a plurality of openings 74.

According to the present embodiment, when a plurality of motor drive units are densely arranged on the cabinet 12 as shown in FIG. 5, a gap 36 is formed between the side plate 68 of one housing 60 and the side plate 66 of another housing 60 which faces the side plate 68. Further, when the housing 60 is arranged so that the side plate 70 faces the wall part 56, a gap 58 is formed between the side plate 70 and the wall part 56. By the gaps 36 and 58, a smooth air flow can be generated between the adjacent housings 60 and between the housing 60 and the wall part 56. Therefore, it is possible to effectively improve the cooling ability upon the operation of the motor drive unit.

Figure 12:
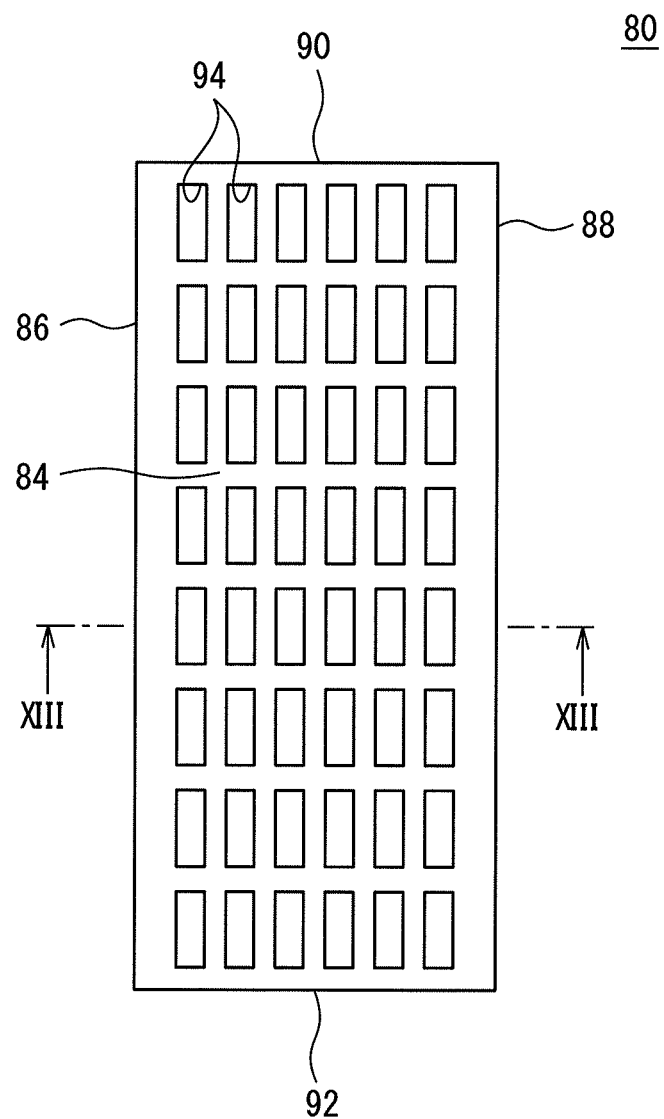
FIG. 12 is a front view of a housing according to still another embodiment, the view corresponding to FIG. 3.
Figure 13:
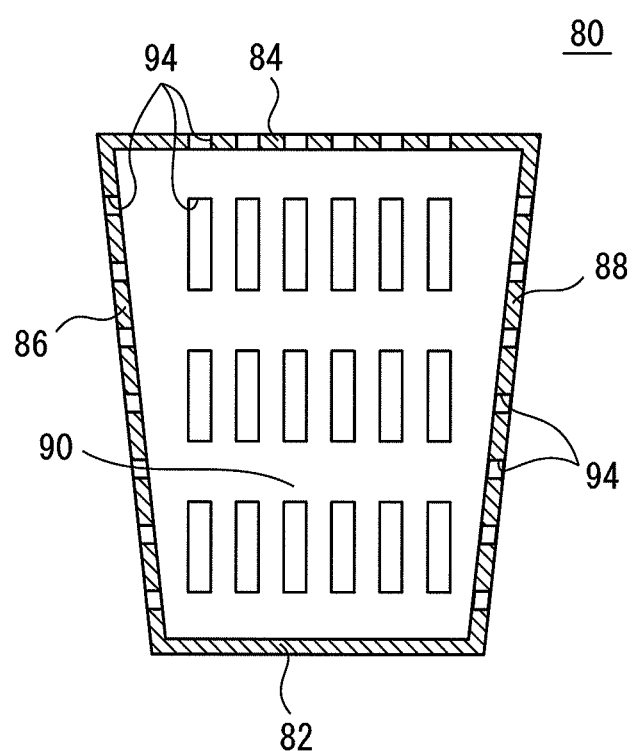
FIG. 13 is a cross-sectional view of the housing shown in FIG. 12 cut along XIII-XIII in FIG. 12.

Next, referring to FIG. 12 and FIG. 13, a housing 80 according to still another embodiment will be explained. The housing 80 includes a back plate 82; a front plate 84 opposite the back plate 82; and a side plate (first side plate) 86, side plate (second side plate) 88, side plate 90 and side plate 92 which extend from the back plate 82 to the front plate 84. The back plate 82 is fixed to the above-mentioned cabinet 12, while the electronic components 14 are fixed to the back plate 82.

The side plates 86 and 88 are arranged so as to be opposite to each other and extend in the longitudinal direction of the housing 80. In the present embodiment, the side plate 86 is slanted with respect to the back plate 82 so as to separate from the side plate 88 as extending from the back plate 82 toward the front plate 84. Similarly, the side plate 88 is slanted with respect to the back plate 82 so as to separate from the side plate 86 as extending from the back plate 82 toward the front plate 84.

Thus, the width in the lateral direction of the housing 80 increases the further from the back plate 82 toward the front plate 84. On the other hand, the side plates 90 and 92 are arranged so as to be opposite to each other substantially in parallel and extend in the lateral direction of the housing 80 from the side plate 86 to the side plate 88. Similar as the above embodiment, each of the front plate 84, side plate 86, side plate 88, side plate 90, and side plate 92 is formed with a plurality of openings 94.

Figure 14:
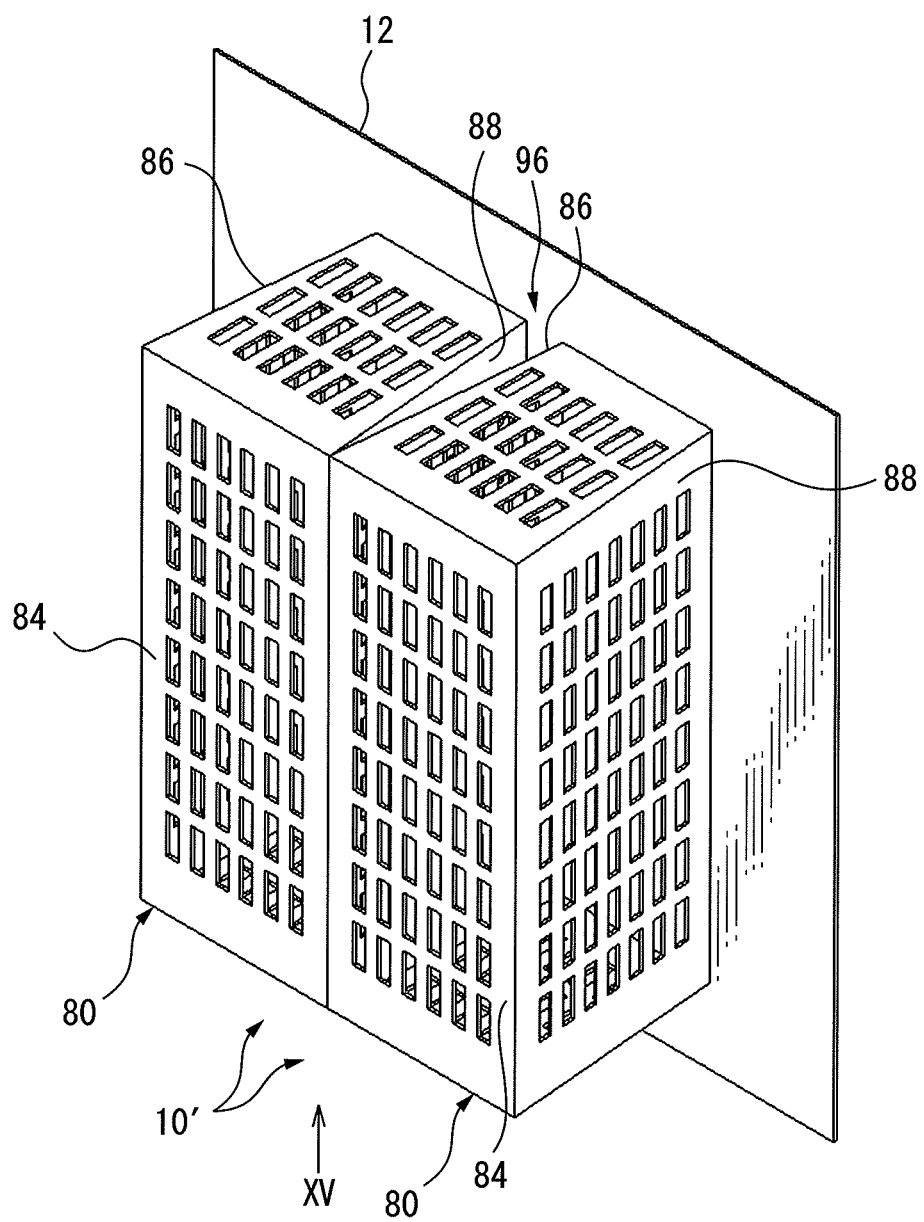
FIG. 14 is a perspective view for explaining the function of the housing shown in FIG. 12, the view corresponding to FIG. 1.
Figure 15:
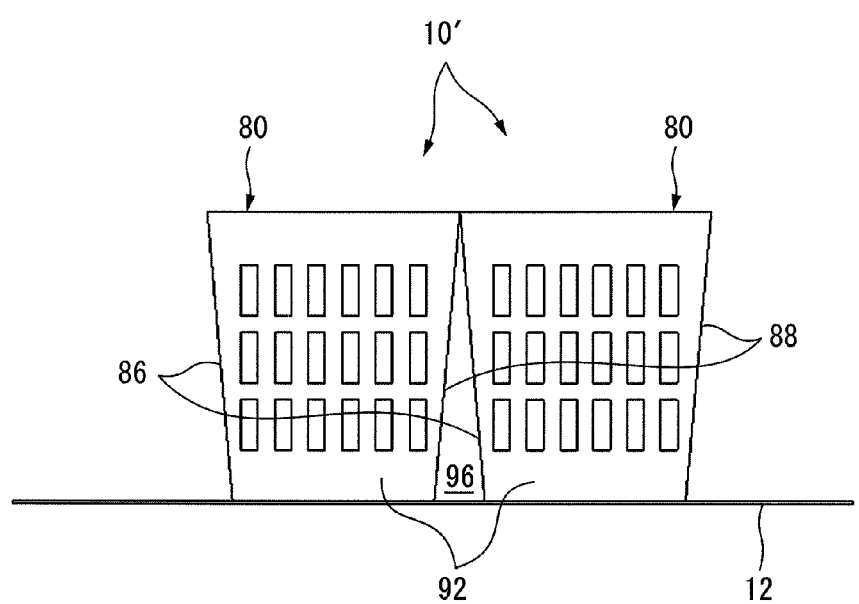
FIG. 15 is a view for explaining the function of the housing shown in FIG. 12 and is seen from the arrow XV in FIG. 14.

Next, referring to FIG. 14 and FIG. 15, the function of the housing 80 according to the present embodiment will be explained. Similar as the embodiment shown in FIG. 1, a plurality of motor drive units 10' are mounted on the cabinet 12 so as to be close to each other. In the example shown in FIG. 15, the motor drive units 10' are densely arranged so that the side plate 88 of the housing 80 of one motor drive unit 10' and the side plate 86 of the housing 80 of the other motor drive unit 10' contact each other at their top ends.

According to the present embodiment, the side plates 88 and 86 are slanted from each other, and therefore even if the motor drive units 10' are densely arranged, a gap 96 is formed between one side plate 88 and the other side plate 86 which faces the side plate 88.

Due to the gap 96, a smooth air flow can be generated between the adjacent housings 80. Accordingly, it is possible to effectively improve the cooling ability during the operation of the motor drive units 10'.

Note that, in the above-mentioned embodiments, the case where both of the facing side plates are slanted with respect to the back plate will be explained. However, the invention is not limited to this. Just one of two facing side plates may be slanted with respect to the back plate, while the other may be perpendicular to the back plate.

Above, embodiments of the invention were used to explain the present invention, but the above embodiments do not limit the inventions according to the claims. Further, combinations of the features which are explained in the embodiments of the present invention may also be included in the technical scope of the present invention. However, not all of the combinations of these features are necessarily essential for the solution of the invention. Further, the fact that the above embodiments can be changed or improved in various ways would be clear to a person skilled in the art.

The invention claimed is:

1. A motor drive unit mounted on a cabinet, comprising:
an electronic component; and
a housing surrounding the electronic component, and including:
a back plate which is fixed to the cabinet and to which the electronic component is fixed;
a front plate opposite the back plate; and
a first side plate and a second side plate which extend from the back plate to the front plate so as to be opposite to each other, wherein
the first side plate includes an opening extending through the first side plate, the first side plate is slanted with respect to the back plate so as to approach the second side plate or separate from the second side plate further from the back surface plate toward the front surface plate wherein the motor drive unit is mounted on the cabinet in close proximity to an other member the other member also having a side plate, wherein the first side plate faces and directly contacts the side plate of the other member and is slanted so as to form a gap between the first side plate and the side plate of the other member to allow an air flow through the opening and the gap to be generated.

2. The motor drive unit according to claim 1, wherein the first side plate and the second side plate are slanted with respect to the back plate so as to approach each other as extending from the back plate toward the front plate.

3. The motor drive unit according to claim 1, wherein the first side plate and the second side plate are slanted with respect to the back plate so as to separate from each other as extending from the back plate toward the front plate.

4. The motor drive unit according to claim 1, wherein the housing further includes a third side plate and a fourth side plate which extend from the back plate to the front plate so as to be opposite to each other, and which extend between the first side plate and the second side plate,
the third side plate includes an opening extending through the third side plate, and is slanted with respect to the back plate so as to approach the fourth side plate or separate from the fourth side plate as extending from the back plate toward the front plate.

5. The motor drive unit according to claim 4, wherein the third side plate and fourth side plate are slanted with respect to the back plate so as to approach each other as extending from the back plate toward the front plate.

6. The motor drive unit according to claim 4, wherein the third side plate and fourth side plate are slanted with respect to the back plate so as to separate from each other as extending from the back plate toward the front plate.

* * * * *